(12) United States Patent
Heertjes et al.

(10) Patent No.: US 8,675,179 B2
(45) Date of Patent: Mar. 18, 2014

(54) CONTROL SYSTEM, LITHOGRAPHIC APPARATUS AND A METHOD TO CONTROL A POSITION QUANTITY OF A CONTROL LOCATION OF A MOVABLE OBJECT

(75) Inventors: Marcel François Heertjes, Best (NL); Daan Willem Theresia Hennekens, 's Hertogenbosch (NL)

(73) Assignee: ASML Netherlands B.V., Veldhoven (NL)

( * ) Notice: Subject to any disclaimer, the term of this patent is extended or adjusted under 35 U.S.C. 154(b) by 509 days.

(21) Appl. No.: 12/683,228

(22) Filed: Jan. 6, 2010

(65) Prior Publication Data
US 2010/0182585 A1    Jul. 22, 2010

Related U.S. Application Data

(60) Provisional application No. 61/146,561, filed on Jan. 22, 2009.

(51) Int. Cl.
*G03B 27/58* (2006.01)

(52) U.S. Cl.
USPC ............................................. 355/72

(58) Field of Classification Search
USPC ................... 355/53, 72; 318/561, 560
See application file for complete search history.

(56) References Cited

U.S. PATENT DOCUMENTS

| | | | | |
|---|---|---|---|---|
| 5,883,702 | A * | 3/1999 | Tokunaga | 355/53 |
| 6,504,162 | B1 * | 1/2003 | Binnard et al. | 250/492.2 |
| 2003/0043354 | A1 * | 3/2003 | Butler | 355/53 |
| 2005/0110970 | A1 * | 5/2005 | Butler | 355/53 |
| 2006/0061751 | A1 * | 3/2006 | Teng et al. | 355/72 |
| 2006/0119829 | A1 * | 6/2006 | Cox et al. | 355/72 |
| 2007/0229794 | A1 * | 10/2007 | Itoh | 355/75 |
| 2007/0236163 | A1 * | 10/2007 | Heertjes et al. | 318/619 |
| 2008/0018877 | A1 * | 1/2008 | Butler et al. | 355/72 |

(Continued)

FOREIGN PATENT DOCUMENTS

| | | |
|---|---|---|
| JP | 2003-115450 | 4/2003 |
| JP | 2004-193425 | 7/2004 |

(Continued)

OTHER PUBLICATIONS

"Data-based feed-forward control for MIMO motion systems" (M. Baggen, M.F. Heertjes, and R. Kamidi; American Control Conference, Seattle, Washington, U.S.A., 2008, pp. 3010-3016).

(Continued)

*Primary Examiner* — Peter B Kim
*Assistant Examiner* — Deoram Persaud
(74) *Attorney, Agent, or Firm* — Pillsbury Winthrop Shaw Pittman LLP

(57) ABSTRACT

A control system configured to position a control location of a movable object in two or more degrees of freedom with respect to another object, including a set-point generator, a position quantity measurement system, a controller including a single input-single output controller for each degree of freedom to control a position quantity of the control location, each controller providing a control signal in logical coordinates on the basis of the error signal; and a gain scheduling device to provide center-of-gravity control signals in center-of gravity coordinates on the basis of the control signals, wherein the gain scheduling device includes a static and a dynamic relationship between logical coordinates and center-of-gravity coordinates of the movable object.

24 Claims, 7 Drawing Sheets

(56) References Cited

U.S. PATENT DOCUMENTS

| | | | |
|---|---|---|---|
| 2008/0309911 A1* | 12/2008 | Maria De Vos et al. | 355/72 |
| 2010/0157264 A1* | 6/2010 | Butler et al. | 355/53 |
| 2011/0149263 A1* | 6/2011 | Roux et al. | 355/72 |
| 2011/0164230 A1* | 7/2011 | Ito | 355/53 |

FOREIGN PATENT DOCUMENTS

| | | |
|---|---|---|
| JP | 2004-273828 | 9/2004 |
| JP | 2006-165564 | 6/2006 |
| JP | 2007-281461 | 10/2007 |
| JP | 2007-318107 | 12/2007 |
| JP | 2008-028392 | 2/2008 |
| JP | 2008-199020 | 8/2008 |
| JP | 2008-219001 | 9/2008 |
| JP | 2008-258613 | 10/2008 |

OTHER PUBLICATIONS

Japanese Office Action mailed Feb. 2, 2012 in corresponding Japanese Patent Application No. 2010-006407.

* cited by examiner

US 8,675,179 B2

CONTROL SYSTEM, LITHOGRAPHIC APPARATUS AND A METHOD TO CONTROL A POSITION QUANTITY OF A CONTROL LOCATION OF A MOVABLE OBJECT

CROSS REFERENCE TO RELATED APPLICATIONS

This application claims priority and benefit under 35 U.S.C. §119(e) to U.S. Provisional Patent Application No. 61/146,561, entitled "Control System, Lithographic Apparatus and A Method To Control A Position Quantity Of A Control Location Of A Movable Object", filed on Jan. 22, 2009. The content of that application is incorporated herein in its entirety by reference.

FIELD

The present invention relates to a control system, a lithographic apparatus and a method to control a position quantity of a control location of a movable object.

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

Important factors for the performance of a lithographic apparatus are the throughput, i.e. the number of wafers that is produced within a certain period, and the overlay, i.e. the production quality. In industry, there is a continuous demand to improve the throughput and overlay of the lithographic apparatus.

In the known lithographic apparatus, the substrate stage accuracy, which is measured in 6 degrees of freedom and is important for overlay, is controlled by using a combination of single input single output (SISO) feedback and feed-forward control for each of the 6 axes. The feedback controller guards (robust) stability and increases disturbance rejection, while the feed-forward controller improves tracking performance.

Generally the two demands higher throughput and overlay performance, contradict each other; higher accelerations (and jerk) cause higher internal dynamic vibrations (or deformations) of the stages, which result in a deterioration of the substrate stage accuracy.

SUMMARY

It is desirable to provide a multivariable control system to control a position quantity of a control location of a movable object, in particular a target portion of a substrate supported on a substrate support, making improved control performance possible.

According to an embodiment of the invention, there is provided a control system configured to position a control location of a movable object in two or more degrees of freedom with respect to another object, the movable object including two or more actuators each configured to actuate the object, wherein the control system includes: a set-point generator configured to provide a set-point position quantity for the movable object for each degree of freedom; a position quantity measurement system configured to measure a position quantity of the object; a subtractor configured to provide for each degree of freedom an error signal by comparing the set-point position quantity and the measured position quantity; a controller including a single input-single output controller for each degree of freedom to control a position quantity of the control location, each single input-single output controller providing a control signal in logical coordinates on the basis of the error signal; and a gain scheduling device to provide centre-of-gravity control signals in centre-of gravity coordinates of the movable object on the basis of the control signals, which centre-of-gravity control signals are used to actuate the movable object, wherein the gain scheduling device includes a static and a dynamic relationship between logical coordinates and centre-of-gravity coordinates of the movable object.

According to an embodiment of the invention, there is provided a lithographic apparatus including: an illumination system configured to condition a radiation beam; a support constructed to support a patterning device, the patterning device being capable of imparting the radiation beam with a pattern in its cross-section to form a patterned radiation beam; a substrate support constructed to hold a substrate; a projection system configured to project the patterned radiation beam onto a target portion of the substrate, and a control system configured to control a position quantity of the target portion of the substrate with respect to the projection system in two or more degrees of freedom, the substrate support including two or more actuators each configured to actuate the substrate support, wherein the control system includes: a set-point generator configured to provide a set-point position quantity in logical coordinates for the movable object for each degree of freedom; a position quantity measurement system to measure a position quantity of the substrate support; a subtractor to provide for each degree of freedom an error signal by comparison of the set-point position quantity and the measured position quantity; a controller including a single input-single output controller for each degree of freedom to control a position quantity of the target portion, each single input-single output controller providing a control signal in logical coordinates on the basis of the error signal; and a gain scheduling device to provide centre-of-gravity control signals in centre-of gravity coordinates of the substrate support on the basis of the control signals, which centre-of-gravity control signals are used to actuate the substrate support, wherein the gain scheduling device includes a static and a dynamic relationship between logical coordinates and centre-of-gravity coordinates of the substrate support.

According to an embodiment of the invention, there is provided a method for controlling a position quantity of a control location of a movable object with respect to another object in two or more degrees of freedom, the movable object including two or more actuators each configured to actuate the object, wherein the method includes providing a set-point position quantity for the movable object for each degree of freedom; measuring a position quantity of the object; providing for each degree of freedom an error signal by comparing the set-point position quantity and the measured position quantity; providing a control signal in logical coordinates on the basis of the error signal for each degree of freedom; scheduling the control signals in logical coordinates into centre-of-gravity control signals in centre-of-gravity coordinates of the object, using a gain scheduling device including a static and a dynamic relationship between logical coordinates and centre-of-gravity coordinates of the movable object; and using the centre-of-gravity control signals to actuate the movable object.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
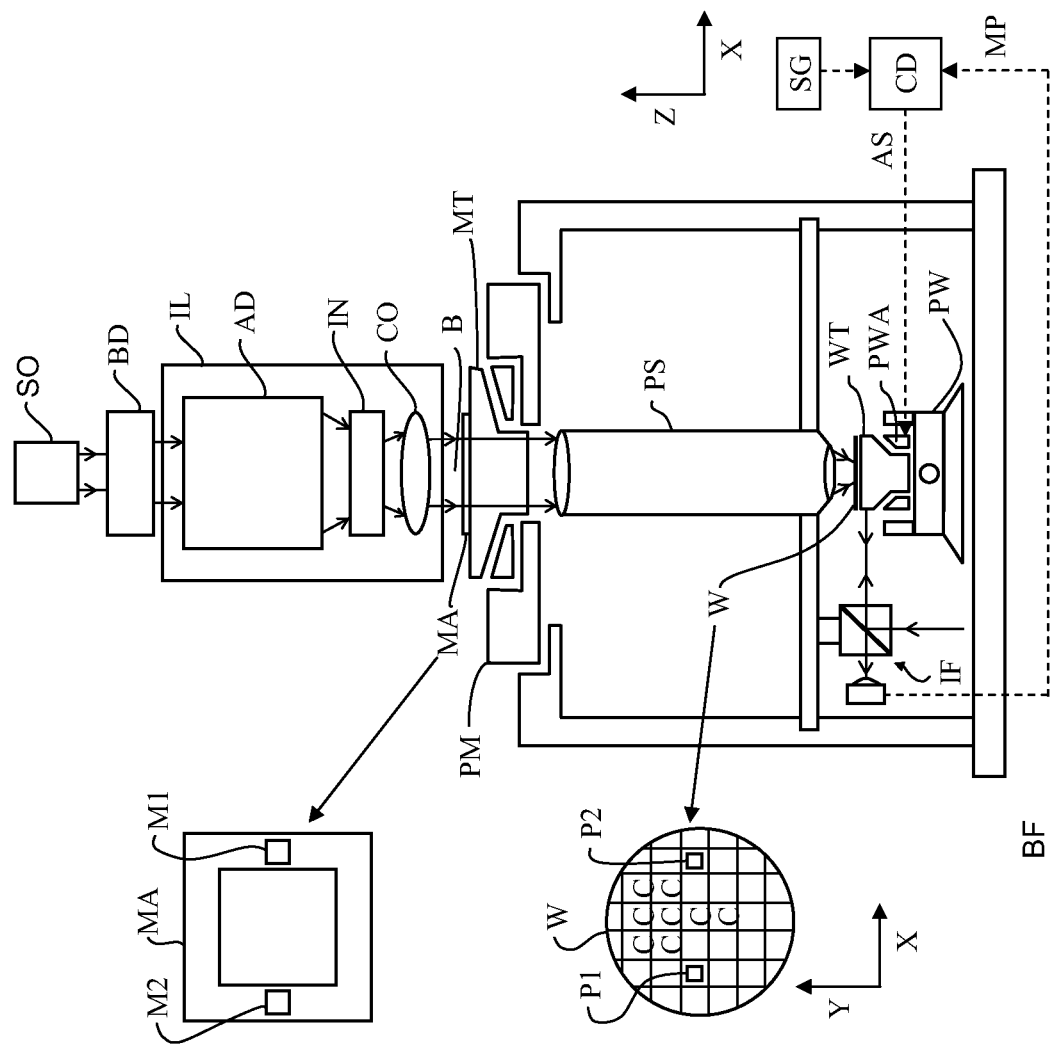
FIG. 1 depicts a lithographic apparatus incorporating an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a patterning device support of mask support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, to direct, shape, or control radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the patterning device (e.g. mask) and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the patterning device support (e.g., mask table) MT, and is patterned by the patterning device. Having traversed the patterning device (e.g. mask) MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the patterning device (e.g. mask) MA with respect to the path of the radiation beam B, e.g. after mechanical retrieval from a mask library, or during a scan. In general, movement of the patterning device support (e.g. mask table) MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the patterning device support (e.g. mask table) MT may be connected to a short-stroke actuator only, or may be fixed. Patterning device (e.g. mask) MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g. mask) MA, the patterning device alignment marks may be located between the dies.

The depicted apparatus could be used in at least one of the following modes:

1. In step mode, the patterning device support (e.g. mask table) MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the patterning device support (e.g. mask table) MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the patterning device support (e.g. mask table) MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device support (e.g. mask table) MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

In the lithographic apparatus according to an embodiment of the invention a control device (also broadly termed hereinafter controller) CD is provided to control the position of the substrate support WT in six degrees of freedom. A set-point generator SG is provided to provide a set-point signal SP to the control device CD. On the basis of the difference between the set-point SP and the measured position MP of the substrate support WT, an actuation signal AS is provided by the control device CD. The actuation signal AS is fed to one or more actuators PWA of the second positioner PW to actuate the substrate support WT and the substrate W supported thereon to the desired position.

For controlling the position of the substrate support, different coordinate systems are used. In the control system, the dynamics of the substrate support WT are described in centre-of-gravity coordinates, i.e. a coordinate system with its origin in the centre of gravity of the substrate support. Actuation of the substrate support is based on these centre-of-gravity coordinates. The set-point position of the target portion of the substrate W supported on the substrate support, which target portion is to be aligned with the projection system PS, is described in logical coordinates, i.e. a coordinate system having a stationary origin. Also, the controllers of the control device, providing a control signal on the basis of an error signal, use logical coordinates. Thus, in the control device a transformation device has to be provided to transform the control signals in logical coordinates into centre-of-gravity control signal in centre-of-gravity coordinates. This transformation will be described with reference to FIG. 2 which shows a control scheme according to an embodiment of the invention.

Further details regarding the relationship between the logical coordinates and the centre-of gravity coordinates are described in "Data-based feed-forward control for MIMO motion systems" (M. Baggen, M. F. Heertjes, and R. Kamidi; American Control Conference, Seattle, Wash., U.S.A., 2008, pp. 3010-3016), the contents of which is herein incorporated by reference.

Figure 2:
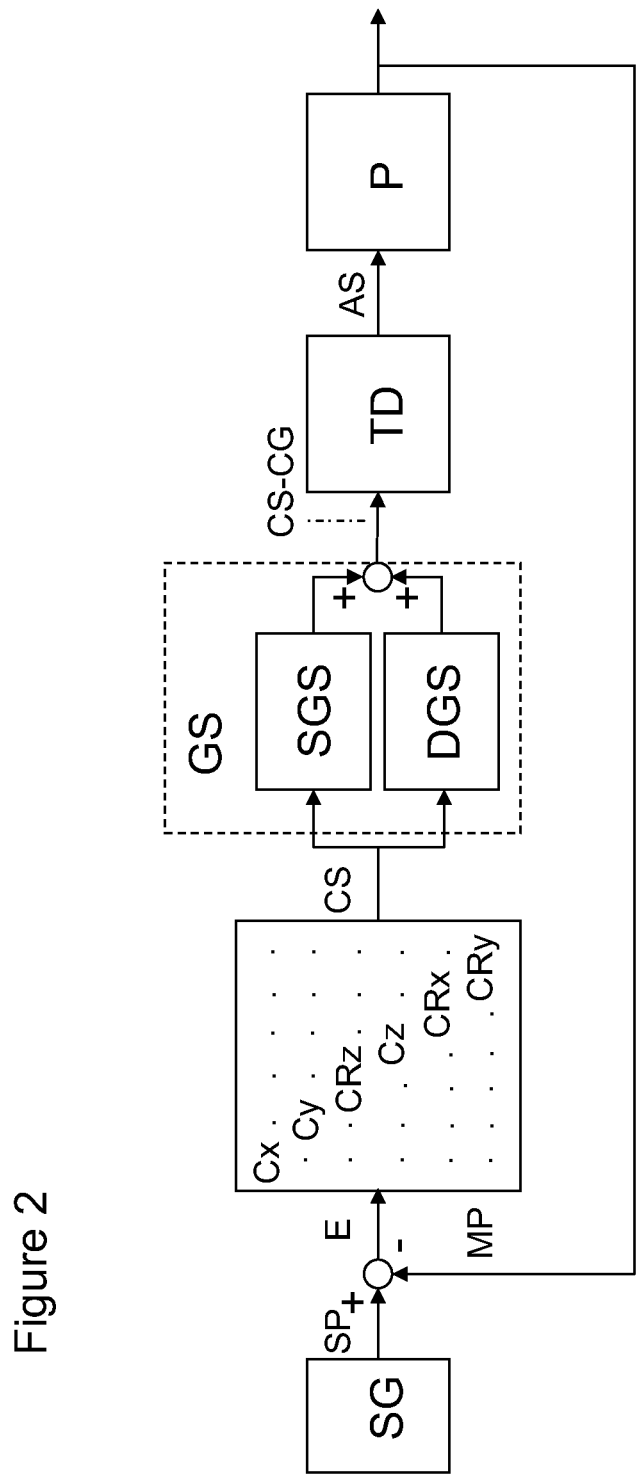
FIG. 2 depicts a multivariable control scheme according to an embodiment of the invention.

FIG. 2 shows a control scheme of a control system according to an embodiment of the invention. The control system includes a set-point generator SG which provides a set-point signal representative for the desired position of the respective target portion C of the substrate W which is to be aligned with respect to the projection system PS. The set-point signal SP is in logical coordinates (x, y, Rz, z, Rx, Ry), i.e. with respect to a stationary coordinate system.

In a subtractor a measured position MP of the substrate support WT is subtracted from the respective set-point SP for each degree of freedom to obtain an error signal E. The measured positions MP are also in logical coordinates. It is remarked that, when required, a transformation matrix may be provided to transform the measurement directions of the position sensors IF of the position measurement system or sensor into the directions of the logical coordinates.

The resulting error signal E is fed to the controller unit. For each logical coordinate a single input-single output controller (SISO) Cx, Cy, Crz, Cz, Crx, Cry is provided. Each controller is optimized for control of the substrate support in the respective logical coordinate. Each controller Cx, Cy, Crz, Cz, Crx, Cry provides a control signal CS on the basis of the error signal E. The control signal is in logical coordinates. However, as explained above, the actuation of the substrate support WT is to be performed in centre-of-gravity coordinates with respect to the centre of gravity of the substrate support.

A gain scheduling device GS is provided to transform the control signal CS in logical coordinates into a centre-of-gravity control signal CS-CG in centre-of-gravity coordinates.

It may be possible that the centre-of-gravity coordinates do not correspond with the actuation directions of the actuators of the second positioner PW. In that case, a transformation device TD may be provided to transform the centre-of-gravity control signal CS-GS into an actuation signal AS for each of the actuators of the second positioner PW. The dynamics of the controlled system, i.e. dynamics of actuators, substrate support and position measurement system is indicated with the block P.

It is remarked that the set-point signal SP, error signal E, control signal CS, centre-of-gravity signal CS-CG, the actuation signal AS and the measured position signal MP each include a value for each of the six degrees of freedom.

The gain scheduling device GS includes a static gain scheduling device SGS including a static relationship between logical coordinates and centre-of-gravity coordinates, and a dynamic gain scheduling device DGS including a dynamic relationship between logical coordinates and centre-of-gravity coordinates.

In a prior art control scheme only a static gain scheduling matrix SGS is provided. In a control system only including a static gain scheduling matrix SGS, rigid body dynamics between the centre-of-gravity of the substrate support WT and the location of the target portion is assumed. As a result, flexibilities in the path between centre-of-gravity and target portion are neglected. This assumption may limit control performance in the presence of flexibilities in the substrate support. In the presence of flexibilities, the static gain scheduling is unable to deal with crosstalk between the subsequent orthogonal axes: x, y, Rz, z, Rx, Ry.

To improve control performance the dynamic gain scheduling matrix DGS is provided. The dynamic gain scheduling matrix is arranged parallel to the static and nominal gain scheduling matrix SGS, i.e. the control signal CS in logical coordinates is fed into both the static gain scheduling matrix SGS and the dynamic gain scheduling matrix DGS, and the output thereof is added to obtain the centre-of-gravity control signal in centre-of-gravity coordinates. Other configurations combining a static and a dynamic relationship between logical coordinates and centre-of-gravity coordinates, may also be applied.

The dynamic gain scheduling matrix DGS of the present example is a six-by-six multi-input multi-output finite impulse response matrix structure. Each entry, or at least each off-diagonal entry, of this matrix includes a dynamic filter in the form:

$$y(k)=c_1 u(k)+c_2 u(k-1)+\ldots +c_n u(k-n+1),$$

where cn represent the FIR filter coefficients. The actual values for these coefficients may be obtained through optimization using a Gauss-Newton method or data-based optimization step. Such method includes the choice of an objective function, the optimization algorithm needed to minimize this objective function, and the derivation of its gradients used in the process of optimization. Further details of such method are for instance described in "Data-based feed-forward control for MIMO motion systems" (M. Baggen, M. F. Heertjes, and R. Kamidi; American Control Conference, Seattle, Wash., U.S.A., 2008, pp. 3010-3016), the contents of which are herein incorporated by reference.

In this case, the number of coefficients for each entry of the dynamic gain scheduling matrix is chosen at n=5. This choice relates to the fact that the input vector u will be differentiated four times at most, which enables the Finite impulse response to counteract up to fourth-order dynamics included in the substrate support. These dynamics are assumed to be the most dominant in view of the flexibilities of substrate support.

Figure 3:
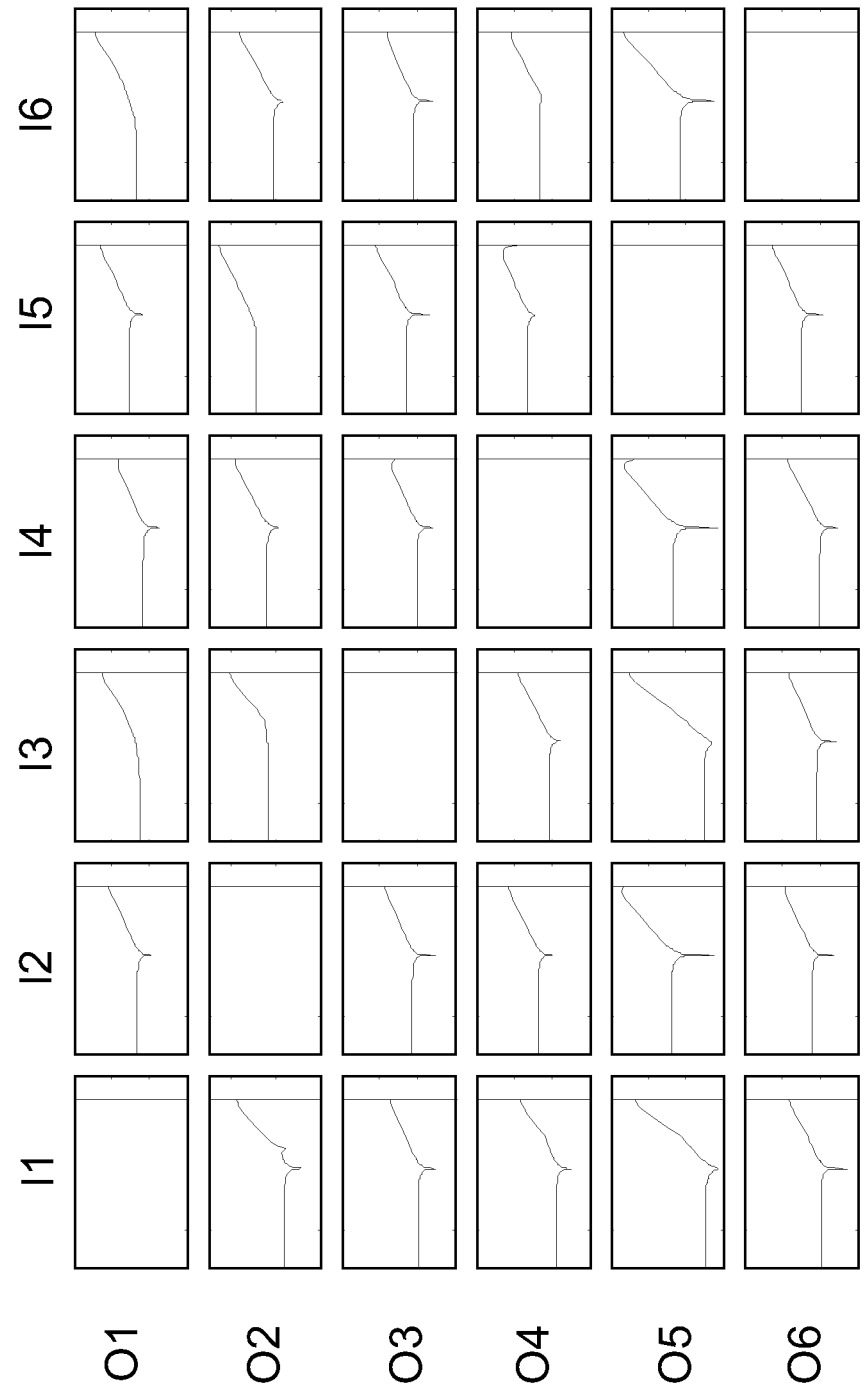
FIG. 3 depicts Bode plots of a dynamic gain scheduling matrix according to an embodiment of the invention.

In FIG. 3, Bode plots of a resulting dynamic gain scheduling matrix is shown. Each Bode plot depicts for each combination of an input, I1, I2, I3, I4, I5, I6 and an output O1, O2, O3, O4, O5, O6, a gain on the vertical axis and frequency on the horizontal axis. The diagonal entries are zero as these combinations are handled by the SISO controllers. Each of the off-diagonal entries shows an inverted fourth-order transfer function which are required to counteract the dynamics of the substrate support WT. Due to the provision of the dynamic gain scheduling matrix DGS next to the static gain scheduling device SGS, the SISO characteristics in the path between controller input and controller output are improved.

Figure 4:
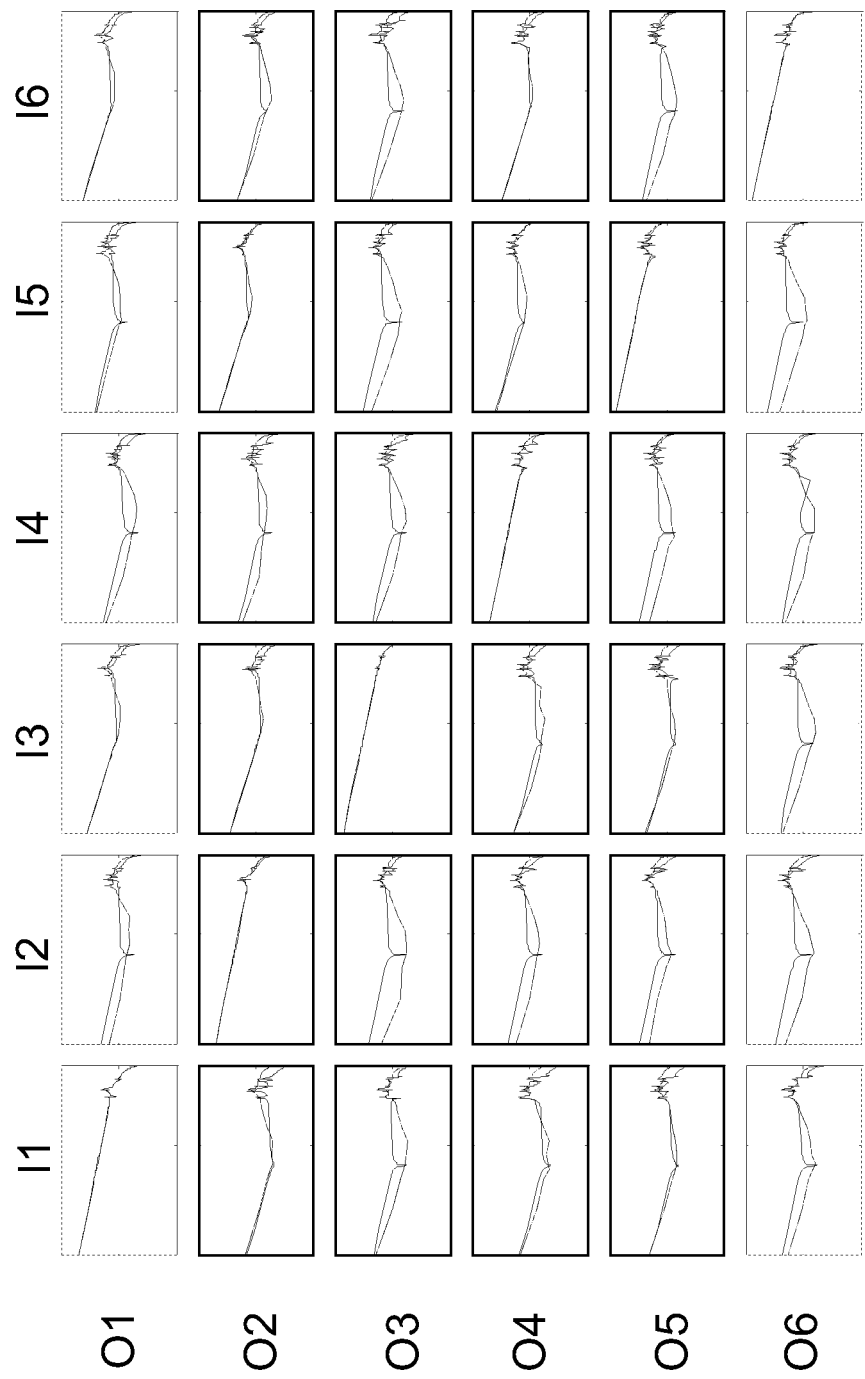
FIG. 4 depicts Bode plots of the compensated mechanics of a controlled movable object without dynamic gain scheduling (solid lines) and with dynamic gain scheduling (dashed lines)

The effect of the provision of the dynamic gain scheduling matrix DGS in the control scheme of FIG. 3 is shown in FIG. 4. In frequency-domain representation the compensated mechanics are shown without (solid lines) SL and with (dashed lines) DL the presence of the dynamic gain scheduling matrix DGS. FIG. 4 clearly shows that most off-diagonal entries show significantly less coupling between respective inputs, I1, I2, I3, I4, I5, I6 and outputs O1, O2, O3, O4, O5, O6.

Figure 5:
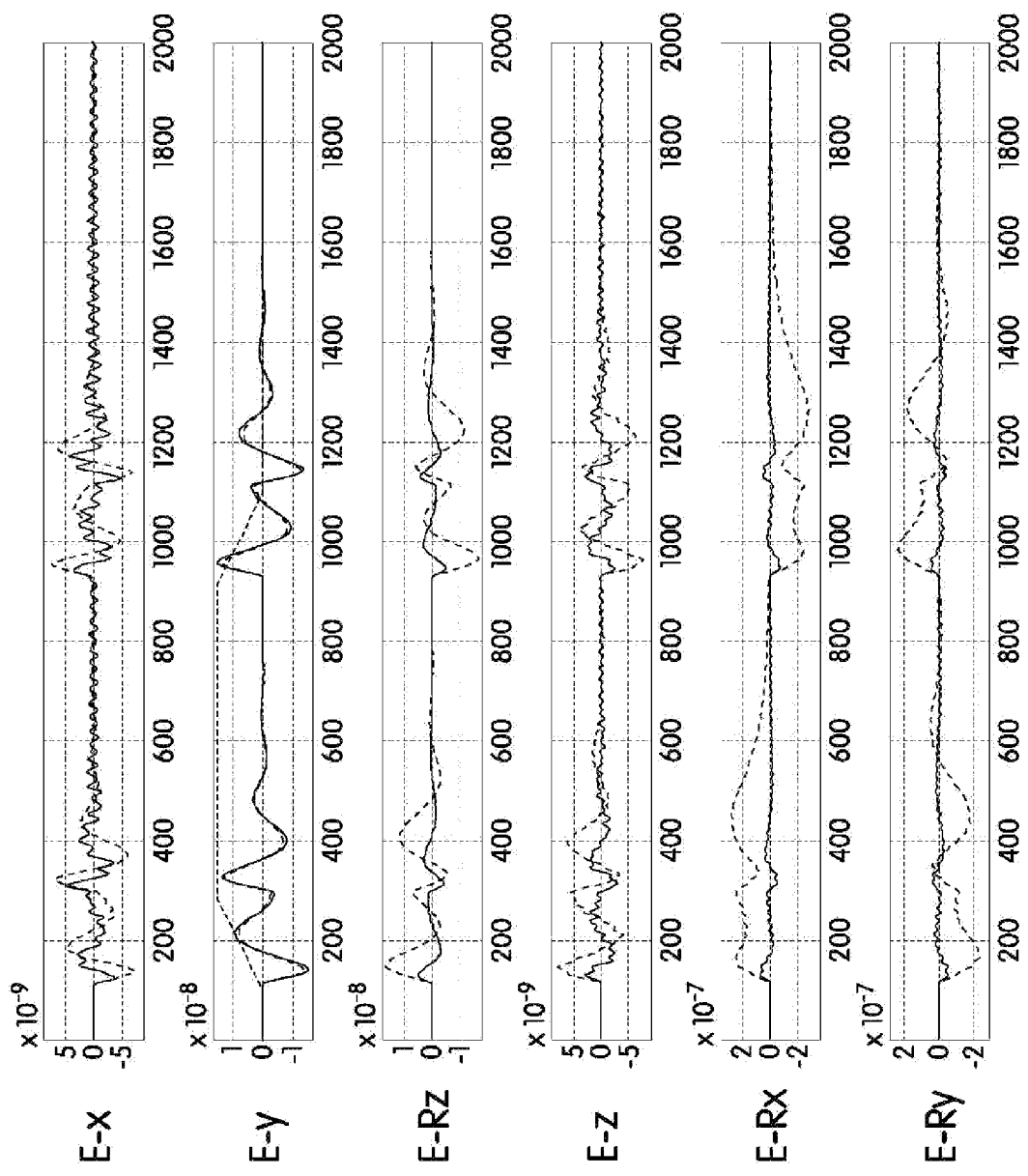
FIG. 5 depicts the resulting errors in all degrees of freedom after actuation in x and y without dynamic gain scheduling (solid lines) and with dynamic gain scheduling (dashed lines)

FIG. 5 shows the effect of the dynamic gain scheduling matrix DGS in time-domain. The x-axis shows the time, expressed in number of samples. On the y-axis, the moving average error E-x, E-y, E-Rz, E-z, E-Rx, E-Ry for each degree of freedom is shown, wherein the errors without the use of a dynamic gain scheduling matrix are drawn in solid lines, and the errors with use of a dynamic gain scheduling matrix are shown in dashed lines. The acceleration profile in x and y is shown in dotted lines. This acceleration profile is scaled and shown for illustrative purposes only. It can be seen from the acceleration profile that the substrate support is first actuated in the x-direction, and thereafter in the y direction.

During an x- or y-scan in a control system without a dynamic gain scheduling matrix, errors (solid lines) occur in respectively x- and y-direction. On top of the errors in the actuated directions, also errors in the other directions Rz, z, Rx, and Ry, are induced through coupling as a result of the flexibilities in the substrate support.

When the dynamic gain scheduling matrix DGS is used in the control system, the errors (dashed lines) in the non-actuated directions Rz, z, Rx, and Ry largely disappear.

The benefit of the provision of a dynamic relationship in the gain scheduling device GS is that improved performance is obtained since flexibilities in the substrate stage are taken into account in the transformation of logical coordinates into centre of gravity coordinates. It is remarked that the addition of such dynamic relationship may also be used to compensate for control performance when less stiff substrate supports are used, for instance to decrease costs of the design.

Hereinabove, a control system and associated control scheme for the control of the position of a substrate support of a lithographic apparatus is described. A corresponding control system and scheme can also be applied for the control of another position quantity, such as velocity or accelerations. The control system and scheme may also be used for the control of a position quantity of another movable object such as for instance a patterning device support, in particular when flexibilities occur in the movable object between the centre-of gravity of the movable object and control location of the movable object which has to be aligned with another stationary or non-stationary object.

The control system was designed to control the movable object, in particular the substrate support in six degrees of freedom, but in another embodiment the control system may also be used to control the position of an object in another number of degrees of freedom, for instance three coplanar degrees of freedom.

In the above-described embodiment, the entries of the dynamic gain scheduling matrix are based on a finite impulse response of fourth order, wherein the coefficients of the entry are based on data-based optimization. In particular auto-regressive filters may be used for this description, but any other suitable description of the static and dynamic relationship between the logical coordinates and the centre-of-gravity coordinates may also be applied. Also, any suitable optimization method as well as any suitable order for the description of the dynamics of the substrate support may be used, whereby preferably the most dominant dynamic effects are incorporated.

In an embodiment, the controller CD is provided to control a vibration isolation system of the lithographic apparatus. The vibration isolation system may be constructed to isolate parts of the lithographic apparatus from vibrations coming from outside the lithographic apparatus. Alternatively or additionally, the vibration isolation system may isolate a part of the lithographic apparatus from another part of the lithographic apparatus. A part that may be isolated may include the projection system PS or a base frame BF configured to support the first positioner PM or the second positioner PW. Isolating certain parts from vibrations may improve the accuracy of the lithographic apparatus.

As the first positioner PM or the second positioner PW may move relative to the base frame BF, the location of the combined centre of gravity of the base frame BF and at least one of the positioners may change.

Figure 6:
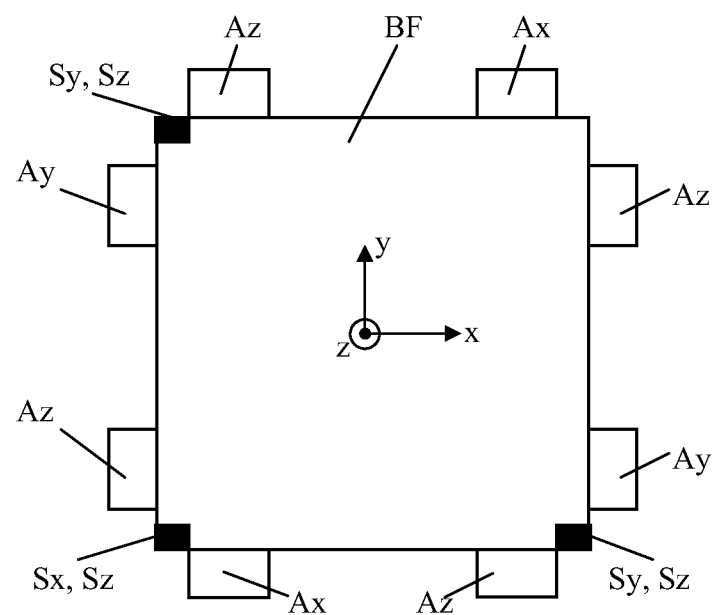
FIG. 6 depicts a vibration isolation system according to an embodiment of the invention.

FIG. 6 schematically shows a vibration isolation system according to an embodiment of the invention. The base frame BF is constrained by using actuators at each corner. Actuators Az support the base frame BF in the vertical z-direction. Actuators Ax and Ay support the base frame BF respectively in the horizontal x- and y-direction.

To measure the position of the base frame BF, sensors a placed at three of the corners. Sensors Sx, Sy and Sz measure respectively in x-, y- and z-direction. The measured values from the sensors may be used to control the actuators Ax, Ay and Az.

The position of the vibration isolation system may be controlled to remain at a certain position. In case a force is applied to the vibration isolation system, or parts supported by the vibration isolation system are moving, the controller may keep the position of the vibration isolation system at a desired value.

To have a good isolating performance, it is desirable for the base frame BF to have a large mass and the actuators Ax, Ay and Az to have a large compliance. This way the base frame BF is supported at a low eigenfrequency. The amplitude of most of the vibrations with a frequency higher than the eigenfrequency are reduced when transferred by the baseframe BF.

Figure 7:
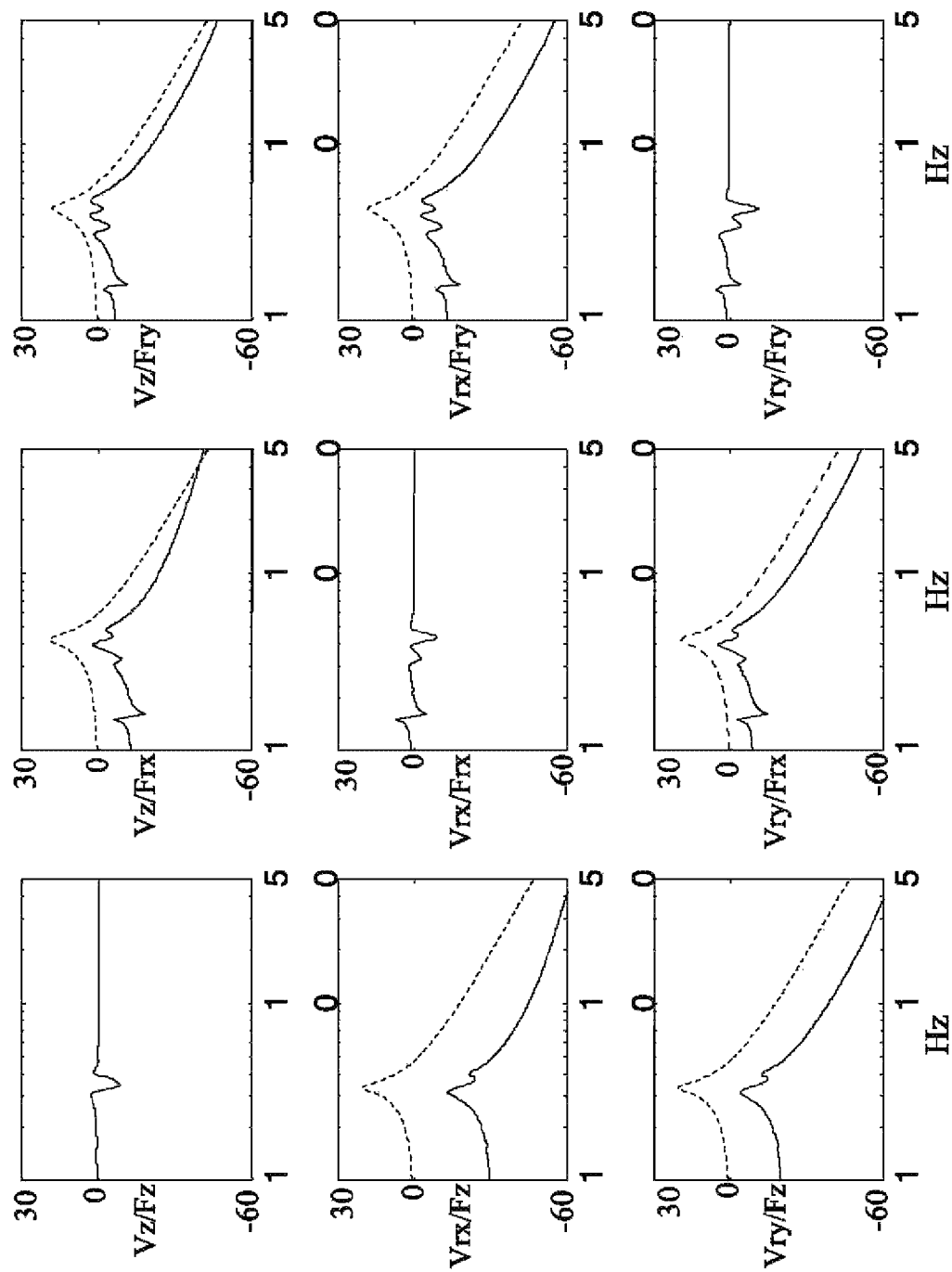
FIG. 7 depicts Bode plots of a dynamic gain scheduling matrix for a vibration isolation system according to an embodiment of the invention.

Similar to FIG. 3, FIG. 7 depicts Bode plots of a dynamic gain scheduling matrix according to an embodiment of the invention for a vibration isolation system. The shown nine transfer functions relate to the vertical directions only, for example movements of the base frame BF that can be made by actuating the actuators Az. These movements are translation in z (z), rotation around x (rx) and rotation around y (ry). The vertical axes show a gain in dB and the horizontal axes show the frequency in Hz. The first row shows a measured z-value in dependency of a vibration in respectively z, rx and ry-directions. The second row shows the same for a measured rx-value. The third row shows the same for a measured ry-value.

The diagonal entries show no dominant dynamics compared to the static 0 dB gain. Therefore, these entries may be compensated by the static gain scheduling device SGS.

The non-diagonal entries show dynamics (solid line) with a resonance peak. The resonance peak is related to the eigenfrequency of the baseframe BF with the compliant actuators Az.

FIR filters may not be very well suited to compensate resonances, because many FIR filter coefficients are needed to approach the transfer function of a resonance. Using a FIR filter with a large number of coefficients requires large calculating capacity and deteriorates the behavior of the controller at high frequencies To compensate the resonances, a second order filter may be used. A known second order filter may have the following expression:

$$\text{output/input} = \frac{a_1 s^2 + b_1 s + c_1}{a_2 s^2 + b_2 s + c_2}$$

The second order filter has constants $a_1, a_2, b_1, b_2, c_1$ and $c_2$ that may be chosen such that the denominator approaches zero for a desired frequency s. At that frequency, a resonance is created. The second order filter may be a low pass-filter, to reduce the amplitude of the second order filter at high frequencies. This helps prevent the second order filter from undesirably increasing vibrations with high frequencies.

In FIG. 7, the combination of a second order filter and a low pass filter are shown (dashed lines). When using a gain scheduling device with a second order filter in series with a FIR filter, the desired compensation transfer functions of FIG. 7 can be made. This way, a minimum of FIR filter coefficients is needed.

Alternatively, the vibration isolation system may be actuated in less than 6 degrees of freedom, for example in 2, 3, 4 or 5 degrees of freedom. The combination of a FIR filter with a second order filter may be used in a controller to control other objects than a vibration isolation system.

In an embodiment there is provided a control system configured to position a movable object in two or more degrees of freedom with respect to another object. The movable object includes two or more actuators configured to actuate the object. The control system includes a set-point generator configured to provide a set-point position quantity for the movable object for each degree of freedom. The control system further includes a position quantity measurement sensor configured to measure a position quantity of the movable object. The control system further includes a subtractor configured to provide for each degree of freedom an error signal by comparing the set-point position quantity and the measured position quantity. The control system further includes a controller including a single input-single output controller for each degree of freedom. The controller is configured to control the position quantity of the movable object. Each single input-single output controller provides a control signal in logical coordinates on the basis of the error signal. The control system further includes a gain scheduling device configured to provide centre-of-gravity control signals in centre-of gravity coordinates of the movable object on the basis of control signals provided by the controller. The centre-of-gravity control signals are used to actuate the movable object. The gain scheduling device includes a static and a dynamic relationship between logical coordinates and centre-of-gravity coordinates of the movable object.

The gain scheduling device may include a dynamic gain scheduling matrix including a dynamic relationship between logical coordinates and centre-of-gravity coordinates of the movable object.

The gain scheduling device may include, in parallel with the dynamic gain scheduling matrix, a static gain scheduling matrix comprising a static relationship between logical coordinates and centre-of-gravity coordinates of the movable object.

The gain scheduling device may include a dynamic filter that includes a relationship between logical coordinates and centre-of-gravity coordinates of the movable object.

The dynamic filter may be an auto-regressive filter. The dynamic filter may be represented by $y(k)=c_1u(k)+c_2u(k-1)+ \ldots +c_nu(k-n+1)$, wherein $c_n$ is a filter coefficient. The filter coefficients may be obtained by a Gauss-Newton method.

The gain scheduling device may include a second order filter.

The movable object may be a patterning device support or substrate support of a lithographic apparatus. The other object may be a projection system of the lithographic apparatus.

The control system may include a transformation device configured to provide actuator signals in actuating directions of the two or more actuators on the basis of the centre-of-gravity control signals.

The control system may be configured to control the object in three planar degrees of freedom. The control system may be configured to control the object in six degrees of freedom.

In an embodiment there is provided a lithographic apparatus including a support, a patterning device, a substrate support, a projection system and a control system. The support is constructed to support the patterning device. The patterning device is capable of imparting a radiation beam with a pattern in its cross-section to form a patterned radiation beam. The substrate support is constructed to hold a substrate. The projection system is configured to project the patterned radiation beam onto a target portion of the substrate. The control system is configured to control a position quantity of the target portion of the substrate with respect to the projection system in two or more degrees of freedom. The substrate support includes two or more actuators configured to actuate the substrate support. The control system includes a set-point generator configured to provide a set-point position quantity in logical coordinates for the substrate support for each degree of freedom. The control system further includes a position quantity measurement system configured to measure a position quantity of the substrate support. The control system further includes a subtractor configured to provide for each degree of freedom an error signal by comparing the set-point position quantity and the measured position quantity. The control system further includes a controller including a single input-single output controller for each degree of freedom. The controller is configured to control the position quantity of the target portion. Each single input-single output controller provides a control signal in logical coordinates on the basis of the error signal. The control system further includes a gain scheduling device configured to provide centre-of-gravity control signals in centre-of gravity coordinates of the substrate support on the basis of control signals provided by the controller. The centre-of-gravity control signals are used to actuate the substrate support. The gain scheduling device includes a static and a dynamic relationship between logical coordinates and centre-of-gravity coordinates of the substrate support.

In an embodiment there is provided a method for controlling a position quantity of a movable object with respect to another object in two or more degrees of freedom. The movable object includes two or more actuators configured to actuate the movable object. The method includes providing a set-point position quantity for the movable object for each degree of freedom. The method further includes measuring a position quantity of the movable object. The method further includes providing for each degree of freedom an error signal by comparing the set-point position quantity and the measured position quantity. The method further includes providing a control signal in logical coordinates on the basis of the error signal for each degree of freedom. The method further includes scheduling the control signals in logical coordinates into centre-of-gravity control signals in centre-of-gravity coordinates of the object, using a gain scheduling device including a static and a dynamic relationship between logical coordinates and centre-of-gravity coordinates of the movable object. The method further includes using the centre-of-gravity control signals to actuate the movable object.

The scheduling may include using a dynamical filter to filter the control signals. The dynamical filter may include a relationship between logical coordinates and centre-of-gravity coordinates of the movable object.

The dynamic filter may be an auto-regressive filter. The dynamic filter may be represented by: $y(k)=c_1u(k)+c_2u(k-1)+ \ldots +c_nu(k-n+1)$, wherein $c_n$ is a filter coefficient. The filter coefficients may be obtained by a Gauss-Newton method.

The movable object may be a patterning device support or substrate support of a lithographic apparatus. The other object may be a projection system of the lithographic apparatus.

The method may comprise transforming the centre-of-gravity control signals into actuator signals in actuating directions of the two or more actuators.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A control system configured to position a movable object in two or more degrees of freedom with respect to another object, the movable object comprising two or more actuators configured to actuate the object, the control system comprising:
    a set-point generator configured to provide a set-point position quantity for the movable object for each degree of freedom;
    a position quantity measurement sensor configured to measure a position quantity of the movable object;
    a subtractor configured to provide for each degree of freedom an error signal by comparing the set-point position quantity and the measured position quantity;
    a controller configured to control the position quantity of the movable object and comprising a plurality of input-single output controllers, each input-single output controller associated with a particular degree of freedom and providing a control signal in logical coordinates on the basis of the error signal; and
    a gain scheduling device configured to provide centre-of-gravity control signals in centre-of gravity coordinates of the movable object on the basis of control signals provided by the controller, the centre-of-gravity control signals being used to actuate the movable object, wherein the gain scheduling device comprises a static gain device and a dynamic gain device, the dynamic gain device arranged in parallel with the static gain device so that the static gain device and the dynamic gain device are adapted to receive the same control signals in logical coordinates outputted by said plurality of input-single output controllers, said static gain device including a static relationship between logical coordinates and centre-of-gravity coordinates of the movable object and said dynamic gain device including a dynamic relationship between logical coordinates and centre-of-gravity coordinates of the movable object.

2. The control system of claim 1, wherein the dynamic gain device comprises a dynamic gain scheduling matrix comprising the dynamic relationship between logical coordinates and centre-of-gravity coordinates of the movable object.

3. The control system of claim 2, wherein the gain scheduling device comprises, in parallel with the dynamic gain scheduling matrix, a static gain scheduling matrix comprising a static relationship between logical coordinates and centre-of-gravity coordinates of the movable object.

4. The control system of claim 2, wherein the gain scheduling device comprises a dynamic filter that includes a relationship between logical coordinates and centre-of-gravity coordinates of the movable object.

5. The control system of claim 4, wherein the dynamic filter is an auto-regressive filter.

6. The control system of claim 4, Wherein the dynamic filter is represented by:

$$y(k)=c_1 u(k)+c_2 u(k-1)+\Lambda+c_n u(k-n+1),$$

wherein $c_n$ is a filter coefficient.

7. The control system of claim 6, wherein the filter coefficients are obtained by a Gauss-Newton method.

8. The control system of claim 6, wherein the gain scheduling device comprises a second order filter.

9. The control system of claim 1, wherein the movable object is a patterning device support or substrate support of a lithographic apparatus, and the other object is a projection system of the lithographic apparatus.

10. The control system of claim 1, wherein the control system comprises a transformation device configured to provide actuator signals in actuating directions of the two or more actuators on the basis of the centre-of-gravity control signals.

11. The control system of claim 1, wherein the control system is configured to control the object in three planar degrees of freedom.

12. The control system of claim 1, wherein the control system is configured to control the object in six degrees of freedom.

13. A lithographic apparatus comprising:
    a support constructed to support a patterning device, the patterning device being capable of imparting a radiation beam with a pattern in its cross-section to form a patterned radiation beam;

a substrate support constructed to hold a substrate;

a projection system configured to project the patterned radiation beam onto a target portion of the substrate, and a control system configured to control a position quantity of the target portion of the substrate with respect to the projection system in two or more degrees of freedom, the substrate support comprising two or more actuators configured to actuate the substrate support, wherein the control system comprises:

a set-point generator configured to provide a set-point position quantity in logical coordinates for the substrate support for each degree of freedom;

a position quantity measurement system configured to measure a position quantity of the substrate support;

a subtractor configured to provide for each degree of freedom an error signal by comparing the set-point position quantity and the measured position quantity;

a controller configured to control the position quantity of the movable object and comprising a plurality of input-single output controllers, each input-single output controller associated with a particular degree of freedom and providing a control signal in logical coordinates on the basis of the error signal; and a gain scheduling device configured to provide centre-of-gravity control signals in centre-of gravity coordinates of the substrate support on the basis of control signals provided by the controller, the centre-of-gravity control signals being used to actuate the substrate support, wherein the gain scheduling device comprises a static gain device and a dynamic gain device, the dynamic gain device arranged in parallel with the static gain device so that the static gain device and the dynamic gain device are adapted to receive the same control signals in logical coordinates outputted by said plurality of input-single output controllers, said static gain device including a static relationship between logical coordinates and centre-of-gravity coordinates of the movable object and said dynamic gain device including a dynamic relationship between logical coordinates and centre-of-gravity coordinates of the substrate support.

14. A method for controlling a position quantity of a movable object with respect to another object in two or more degrees of freedom, the movable object comprising two or more actuators configured to actuate the movable object, the method comprising:

providing a set-point position quantity for the movable object for each degree of freedom;

measuring a position quantity of the movable object;

providing for each degree of freedom an error signal by comparing the set-point position quantity and the measured position quantity;

providing a control signal in logical coordinates on the basis of the error signal for each degree of freedom;

scheduling the control signals in logical coordinates into centre-of-gravity control signals in centre-of-gravity coordinates of the object, using a gain scheduling device comprising a static gain device and a dynamic gain device, the dynamic gain device arranged in parallel with the static gain device so that the static gain device and the dynamic gain device are adapted to receive the same control signals in logical coordinates, said static gain device including a static relationship between logical coordinates and centre-of-gravity coordinates of the movable object and said dynamic gain device including a dynamic relationship between logical coordinates and centre-of-gravity coordinates of the movable object; and using the centre-of-gravity control signals to actuate the movable object.

15. The method of claim 14, wherein the scheduling includes using a dynamical filter to filter the control signals, the dynamical filter including a relationship between logical coordinates and centre-of-gravity coordinates of the movable object.

16. The method of claim 15, wherein the dynamic filter is an auto-regressive filter.

17. The method of claim 15, wherein the dynamic filter is represented by:

$$y(k)=c_1u(k)+c_2u(k-1)+\Lambda+c_nu(k-n+1),$$

wherein $c_n$ is a filter coefficient.

18. The method of claim 17, wherein the filter coefficients are obtained by a Gauss-Newton method.

19. The method of claim 14, wherein the movable object is a patterning device support or substrate support of a lithographic apparatus, and the other object is a projection system of the lithographic apparatus.

20. The method of claim 14, wherein the method comprises transforming the centre-of-gravity control signals into actuator signals in actuating directions of the two or more actuators.

21. A multi-input multi-output (MIMO) servo system to control a scanning stage, the MIMO servo system comprising:

a single-input single-output (SISO) controller configured to control two or more degrees of freedom of a movable object based on a static rigid-body decoupling that uses a gain scheduling matrix which defines a static relation between forces in centre-of-gravity coordinates of the movable object and forces in logical coordinates of the movable object, wherein the SISO controller is configured to control the two or more degrees of freedom of the movable object based on the static rigid-body decoupling in combination with a dynamic decoupling that uses a multi-input multi-output (MIMO) finite impulse response (FIR) matrix in parallel to the gain scheduling matrix to obtain a dynamic gain scheduling finite impulse response matrix such that the MIMO-FIR matrix defines a dynamic relation between forces in centre-of-gravity coordinates of the movable object and forces in logical coordinates of the movable object, and wherein the gain scheduling matrix that defines a static relation and the dynamic gain scheduling finite impulse response matrix are arranged in parallel so as to receive a same control signal.

22. The servo system of claim 21, wherein each entry in the MIMO-FIR matrix comprises a dynamic filter.

23. The servo system of claim 21, wherein the dynamic decoupling is obtained through time-domain optimization of the dynamic gain scheduling finite impulse response matrix.

24. The servo system of claim 23, wherein each entry of the dynamic gain scheduling finite impulse response matrix is based on a finite impulse response of fourth order, wherein the coefficients of the each entry are based on data-based optimization.

* * * * *